United States Patent [19]

Carlson et al.

[11] 4,442,310

[45] Apr. 10, 1984

[54] PHOTODETECTOR HAVING ENHANCED BACK REFLECTION

[75] Inventors: David E. Carlson, Yardley, Pa.; Brown F. Williams, Princeton, N.J.

[73] Assignee: RCA Corporation, New York, N.Y.

[21] Appl. No.: 398,631

[22] Filed: Jul. 15, 1982

[51] Int. Cl.³ ............................................. H01L 31/06
[52] U.S. Cl. .................................... 136/256; 136/249; 136/258; 136/259; 357/30
[58] Field of Search ................. 357/30; 136/258 AM, 136/259, 249 TJ, 256

[56] References Cited

U.S. PATENT DOCUMENTS

| 4,064,521 | 12/1977 | Carlson | 357/2 |
| 4,109,271 | 8/1978 | Pankove | 357/30 |
| 4,126,150 | 11/1978 | Bell et al. | 136/255 |
| 4,166,919 | 9/1979 | Carlson | 136/257 |
| 4,216,501 | 8/1980 | Bell | 358/128.5 |
| 4,400,577 | 8/1983 | Spear | 136/259 |

FOREIGN PATENT DOCUMENTS 55-108789 8/1980 Japan ..................... 136/258 AM

OTHER PUBLICATIONS

M. Ondris et al., "Hydrogenated A–Si Multi-Junction Solar Cells & Interference Effects in the Spectral Response", *Proceedings, 3rd European Community Photovoltaic Solar Energy Conf.* (1980), Reidel Pub. Co. (1981), pp. 809–814.

*Primary Examiner*—Aaron Weisstuch
*Attorney, Agent, or Firm*—Birgit E. Morris; Donald S. Cohen; William J. Burke

[57] ABSTRACT

A photodetector having a light transmissive and electrical conducting spacer layer interposed between a semiconductor body having a semiconductor junction therein and a light reflective electrical contact to the body. The spacer layer may have a thickness of about one-half the wavelength of light passing through the body and impinging on the spacer layer or the thicknesses of the spacer layer and the active body may be so adjusted that the reflectivity of the photodetector at a particular wavelength is reduced.

19 Claims, 5 Drawing Figures

PHOTODETECTOR HAVING ENHANCED BACK REFLECTION

The invention relates to a photodetector having enhanced back reflection thereby increasing the optical absorption and reducing the overall reflectivity of the device.

The United States Government has rights in this invention pursuant to Contract No. SERI XG-0-9372-1.

BACKGROUND OF THE INVENTION

Photodetectors, such as a solar cell, having a thin active body, typically exhibit a conversion efficiency less than the maximum obtainable because the absorption coefficient of the body for light at a particular wavelength is too small. This effect is often compensated for by using for the back electrical contact to the body a material, such as metal, exhibiting high reflectivity so that the transmitted light is reflected back into the body. However, most contact materials do not efficiently reflect light at this interface. For example, in an hydrogenated amorphous silicon solar cell such as that disclosed by Carlson in U.S. Pat. No. 4,064,521, incorporated herein by reference, a chromium metal contact reflects only about 25 percent of the light in the wavelength region range between about 0.6 and 0.7 micrometers ($\mu$m) and materials such as molybdenum and steel reflect even less light. An aluminium contact to the amorphous silicon body reflects about 73 percent of the incident light in this wavelength range but will cause degradation of the device performance if heated above a temperature of between about 100° C. and 150° C.

Thus, it would be desirable to have a photodetector structure in which the absorption in the semiconductor body is increased and undesirable side effects such as degradation of the device performance upon heating are reduced.

SUMMARY OF THE INVENTION

The photodetector of the invention comprises a body including a semiconductor material having a semiconductor junction therein, a first electrical contact to a surface of the body through which light impinges on the body, a light transmissive and electrically conducting spacer layer overlying the opposed surface of the body and a light reflective electrical contact overlying the spacer layer.

DETAILED DESCRIPTION OF PREFERRED EMBODIMENTS

Figure 1:
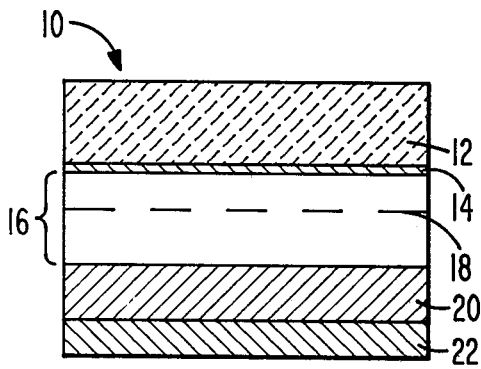
FIGS. 1–5 are cross-sectional views of different embodiments of the photodetector of the invention.

In FIG. 1, a photodetector 10 includes a light transmissive substrate 12, a light transmissive first electrical contact 14 overlying the substrate 12, a body 16 overlying the first electrical contact 14 and having a semiconductor junction 18 therein, a light transmissive and electrically conducting spacer layer 20 overlaying the body 16 and a light reflective second electrical contact 22 overlying the spacer layer 20.

The body 16 includes a semiconductor material such as gallium arsenide, indium phosphide, cadmium sulfide, or single crystal, polycrystalline, or hydrogenated amorphous silicon. The body 16 may be formed by cutting a thin wafer from a boule of a single crystal material; depositing a layer of the material on a substrate by well known liquid or vapor phase epitaxial techniques or, in the case of amorphous silicon, by glow discharge techniques; such as are disclosed by Carlson in U.S. Pat. No. 4,064,521, with a substrate temperature between about 200° C. and 350° C. and preferably about 250° C. For amorphous silicon the body 16 is typically between about 200 and 1,000 nanometers (nm) thick and preferably between about 300 and 600 nm thick.

Figure 2:
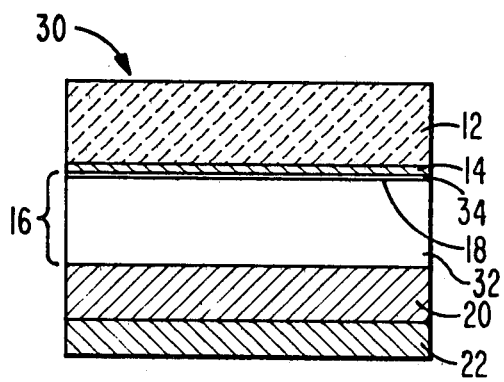
Figure 3:
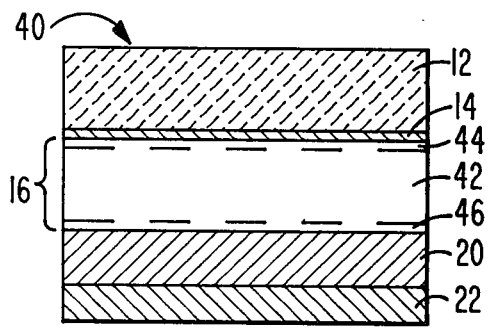

The semiconductor junction 18 includes any type of barrier which will cause electrons and holes generated by the absorption of light in the body to move in opposite directions. Thus, the semiconductor junction 18 may be a p-n junction with the portions of the active body on either side of the junction 18 being of opposite conductivity type. In FIGS. 2 and 3, where the indentification of the elements common to these FIGS. and to FIG. 1 is the same, two alternative embodiments of the semiconductor junction 18 are shown. In FIG. 2 the photodetector 30 includes a body 16 in which the semiconductor junction 18 is a Schottky barrier with the junction 18 occurring at the interface between a semiconductor region 32 of the body 16 and a thin metal region 34 which is also part of the body 16 and is adjacent to the first electrical contact 14. The region 34 is typically between about 5 and 10 nm thick and is composed of a metal such as platinum or palladium. In FIG. 3 the photodetector 40 includes a body 16 having an intrinsic type conductivity region 42 and regions of opposite conductivity type 44 and 46 thereby forming a p-i-n type semiconductor junction 18 across the region 42 of intrinsic conductivity type. The regions of opposite conductivity type 44 and 46 are typically between about 5 and 50 nm thick and are formed by adding an appropriate dopant gas to the glow discharge. Alternatively, these regions may be formed of a silicon-carbon alloy, such as that disclosed by Pankove in U.S. Pat. No. 4,109,271, incorporated herein by reference, or a silicon-nitrogen alloy.

The intrinsic type conductivity of the region 42 is understood to include those cases where the region 42 has a small p or n-type conductivity either as a result of accidental contamination or intentional doping. If the intrinsic region 42 has a particular conductivity type it is preferred that it be of opposite conductivity type to that of the region 44 adjacent to the first electrical contact 14, thereby forming the semiconductor junction 18 at the interface between the regions 42 and 44.

The substrate 12 through which light enters the body 16 is composed of a light transmissive material such as glass or plastic having sufficient mechanical strength to support the remainder of the structure.

Typically, the substrate 12 is between about 1.5 and 6 millimeters (mm) thick.

Figure 4:
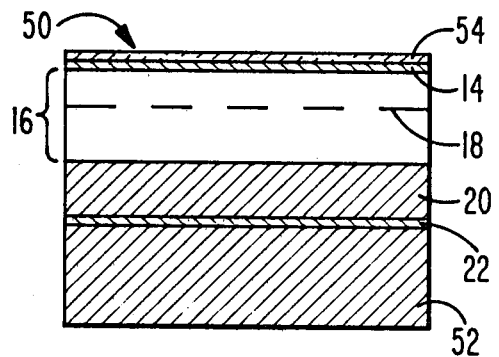

In FIG. 4 the photodetector 50 differs from the photodetector 10 of FIG. 1 in that the substrate 12 is replaced by a substrate 52 adjacent to the second electrical contact 22. Alternatively, the second electrical contact 22 and the substrate 52 may be combined into a single electrically conducting element sufficient to suport the remainder of the structure. The substrate 52 may be composed of a metal such as steel or copper about 1.5 mm thick. The photodiode 50 also includes a light transmissive protective layer 54 overlying the first electrical contact 14.

The first electrical contact 14 is composed of a light transmissive material including a layer of transparent conductive oxide such as indium-tin oxide which is between about 80 and 300 nm thick. The layer of transparent conductive oxide may be deposited by electron beam evaporation, chemical vapor deposition, or by sputtering using techniques well known in the art. The second electrical contact 22 typically covers all, or almost all, of the surface of the spacer layer 20 and is preferably a material, such as a metal, which exhibits a high reflectivity in the wavelength range of the light which impinges on the contact after transmission through the active body 16 and the spacer layer 20 and is typically between about 100 and 500 nm thick. Preferably, the second electricaL contact 22 is composed of a metal such as aluminum, gold, copper, or silver which may be deposited by thermal or electron beam evaporation or sputtering.

The spacer layer 20 is composed of a wide bandgap material which is substantially light transmissive in the wavelength range of the light which impinges on it and is also electrically conductive. This layer is typically composed of a transparent conducting oxide such as indium-tin oxide or tin oxide. The thickness of this layer is typically greater than about 5 nm and preferably greater than about 10 nm.

Alternatively, the spacer layer 20 may be composed of a wide-bandgap semiconductor material which is light transmissive in the wavelength range of interest. A suitable material for the spacer layer 20 includes an amorphous silicon-carbon alloy such as that disclosed by Pankove in U.S. Pat. No. 4,109,271, or an amorphous silicon-nitrogen alloy. The silicon-carbon alloy may be deposited from a glow discharge containing silane and methane while the silicon-nitrogen alloy may be deposited from a discharge containing silane and ammonia. In this case the spacer layer has the same conductivity type as the region of the body 16 which it overlies in order to insure that a second semiconductor junction is not formed at the interface of the active body 16 and the spacer layer 20. Alternatively, the spacer layer 20 and the region 46 of the body 16 may be combined with a suitably doped spacer layer providing both the region of opposite conductivity type and the spacing function of the spacer layer. In either case the contact resistance should be less than about 1 ohm-cm$^2$.

There are two choices in determining the optimum thickness of the spacer layer 20. The first is to choose the thickness of this layer to be about one-half the wavelength in the spacer layer, or integral multiples thereof, of the light in the wavelength range of interest. Typically this thickness is between between about 75 and 350 nm. This choice removes the second electrical contact 22 from direct contact with the body 16 thereby eliminating the undesirable side effects of such direct contact for many useful materials. Optically, this choice for the spacer layer thickness is neutral at a particular wavelength in that it does not appreciably affect the reflectivity of the photodetector but at other wavelengths the reflectivity will be changed.

The second choice is to select the thicknesses of the body 16 and the spacer layer 20 such that the reflectivity of the photodetector for light in the particular range of wavelengths is reduced and is preferably minimized. The optimal values of the thickness of the body 16 and the spacer layer 20 can be calculated using, for example, the matrix method as discussed in "Optical Properties of Thin Solid Films" by O. S. Heavens, Dover Publications, Inc., New York, 1965, p. 69. In the photodetectors of the invention the thickness of the spacer layer 20 is so related to the thickness of the body 16 and to the thicknesses of any other layers through which light passes and the optical constants of the second electrical contact 22, the spacer layer 20, the body 16 and any other layers through which light passes including the first electrical contact 14 and the substrate 12 that the reflectivity of the photodetector in a particular wavelength range is reduced and preferably minimized. Typically the thickness of the spacer layer is between about 10 and 200 nm.

The photodetector formed when the thicknesses of the spacer layer and the body are chosen under these latter conditions is a light trapping structure in which light entering the photodetector undergoes multiple passes between the entry surface of the photodectector and the second electrical contact until it is absorbed by one of the layers.

For a photodetector such as a solar cell which is preferably sensitive over a wide range of wavelengths extending from about 400 nm to 1000 nm, this structure is particularly useful since the detector is typically only weakly absorbing over a significant portion of this range of wavelengths. In particular, the hydrogenated amorphous silicon solar cell disclosed by Carlson in U.S. Pat. No. 4,064,521 is weakly absorbing for wavelengths greater than about 600 nm. In such a case, the thicknesses of the spacer layer and the body may be chosen to minimize the reflectivity and maximize the absorption at a wavelength of about 650 nm. An anti-reflection condition is, however, typically not obtained since the absorption of the active body is weak.

Figure 5:
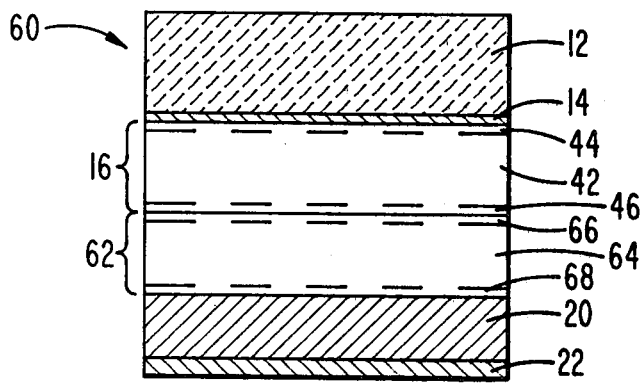

In FIG. 5 a series-connected tandem photodetector 60 incorporating the invention differs from the photodetector 40 of FIG. 3 in that a tandem semiconductor body 62 is interposed between the body 16 and the spacer layer 20. The tandem body 62 has therein a semiconductor junction which includes a region 64 of intrinsic conductivity type and oposed regions 66 and 68 of opposite conductivity type. The region 66 of the tandem body 62 and the adjacent region 46 of the body 16 are of opposite conductivity type with a tunnel junction therebetween. The tandem body 62 is typically composed of a material having a lower bandgap energy than that of the body 16 so that light which passes through the weakly absorbing body 16 is then absorbed in the tandem body 62. Typically, in a photodetector operating as a solar cell the body 16 is composed of hydrogenated amorphous silicon and the tandem body is composed of a hydrogenated amorphous silicon-germanium alloy deposited from a glow discharge containing silane and germane. The thickness of the spacer layer 20 may then be either one-half of a particular wavelength in the spacer layer or it may be chosen in conjunction with the thickness of the tandem body 62 and the body 16 and any other layers through which the light is transmitted such that the reflectivity of the photodetector 60 at a particular wavelength is reduced and preferably minimized. The relative thicknesses of the body 16 and the tandem body 62 and their compositions are adjusted so that the photo-generated electrical currents from each body are the same.

I claim:

1. A photodetector comprising:
    a body including a semiconductor material, having a semiconductor junction therein and having first and second opposed major surfaces;
    a first electrical contact to the first major surface through which light impinges on the body;

a light transmissive and electrically conducting spacer layer overlying the second major surface of the body; and a light reflective second electrical contact overlying the spacer layer;

wherein the optical constants of the second electrical contact, the spacer layer and the body and the thicknesses of the spacer layer and the body are such that the overall reflectivity of the photodetector is minimized at a particular wavelength of light.

2. The photodetector of claim 1 wherein the thickness of the spacer layer is about one-half of a particular wavelength of light in the material comprising the spacer layer.

3. The photodetector of claim 2 wherein the thickness of the spacer layer is between about 75 and 350 nm.

4. The photodetector of claim 1 wherein the thickness of the spacer layer is between about 5 and 200 nm.

5. The photodetector of claim 1, 2 or 4 wherein the body includes a hydrogenated amorphous silicon material.

6. The photodetector of claim 1, or 2 wherein the semiconductor junction is p-n junction.

7. The photodetector of claim 1, or 2 wherein the body includes a region of intrinsic conductivity type and opposed regions of opposite conductivity type thereby forming a p-i-n junction.

8. The photodetector of claim 1, or 2 wherein the body includes a layer adjacent to the first electrical contact which is composed of a material different from the remainder of the body thereby forming a Schottky barrier.

9. The photodetector of claim 1, or 2 wherein the spacer layer is composed of a transparent conducting oxide and the second electrical contact is composed of material selected from the group consisting of aluminum, gold, silver and copper.

10. The photodetector of claim 1, or 2 wherein the spacer layer includes a material selected from the group consisting of hydrogenated silicon-carbon and silicon-nitrogen alloys.

11. The photodetector of claim 1, having a light transmissive substrate adjacent to the first electrical contact.

12. The photodetector of claim 1 having a substrate adjacent to the second electrical contact.

13. The photodetector of claim 1, wherein a tandem semiconductor body having a semiconductor junction therein is interposed between the semiconductor body and the spacer layer.

14. A solar cell comprising:

a light transmissive substrate;

a first electrical contact overlying a surface of the substrate;

a body including hydrogenated amorphous silicon overlying the first electrical contact and having a semiconductor junction therein;

a light transmissive and electrically conducting spacer layer overlying the body; and a light reflective second electrical contact overlying the spacer layer;

wherein the optical constants of the second electrical contact, the spacer layer and the body and the thicknesses of the spacer layer and the body are such that the overall reflectivity of the solar cell is minimized at a particular wavelength of light.

15. The solar cell of claim 14 wherein the thickness of the spacer layer is about one-half of a particular wavelength in the material comprising the spacer layer.

16. The photodetector of claim 1 wherein the particular wavelength is greater than about 600 nanometers.

17. The photodetector of claim 16 wherein the particular wavelength is about 650 nanometers.

18. The solar cell of claim 14 wherein the particular wavelength is greater than about 600 nanometers.

19. The solar cell of claim 18 wherein the particular wavelength is about 650 nanometers.

* * * * *